United States Patent
Kim et al.

(10) Patent No.: US 9,229,264 B2
(45) Date of Patent: Jan. 5, 2016

(54) STEREOSCOPIC IMAGE DISPLAY DEVICE AND METHOD FOR MANUFACTURING THE SAME

(71) Applicant: LG DISPLAY CO., LTD., Seoul (KR)

(72) Inventors: Jin-Yeong Kim, Paju-si (KR);
Hee-Young Chae, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 226 days.

(21) Appl. No.: 13/690,686

(22) Filed: Nov. 30, 2012

(65) Prior Publication Data

US 2014/0002776 A1 Jan. 2, 2014

(30) Foreign Application Priority Data

Jul. 2, 2012 (KR) .................. 10-2012-0071775

(51) Int. Cl.
| | | |
|---|---|---|
| *G02F 1/1335* | (2006.01) | |
| *H05K 13/04* | (2006.01) | |
| *G02B 27/22* | (2006.01) | |
| *G02B 5/30* | (2006.01) | |
| *G02B 27/26* | (2006.01) | |
| *H04N 13/04* | (2006.01) | |

(52) U.S. Cl.
CPC ........ *G02F 1/133512* (2013.01); *G02B 5/3083* (2013.01); *G02B 27/2214* (2013.01); *G02B 27/26* (2013.01); *H05K 13/04* (2013.01); *H04N 13/0434* (2013.01); *H04N 2213/001* (2013.01); *Y10T 29/4913* (2015.01)

(58) Field of Classification Search
CPC ............... G02B 27/2214; G02F 1/133512

USPC ................ 349/15; 348/42–60; 7/15
See application file for complete search history.

(56) References Cited

U.S. PATENT DOCUMENTS

| | | | | |
|---|---|---|---|---|
| 8,760,505 | B2* | 6/2014 | Baik et al. .......... | 348/58 |
| 2012/0140129 | A1* | 6/2012 | Chang et al. ........ | 349/15 |
| 2012/0162763 | A1 | 6/2012 | Son et al. | |
| 2013/0155504 | A1* | 6/2013 | Kim et al. .......... | 359/464 |
| 2013/0155505 | A1* | 6/2013 | Kim et al. .......... | 359/465 |

FOREIGN PATENT DOCUMENTS

CN 103163652 A 6/2013

OTHER PUBLICATIONS

Extended European Search Report issued in corresponding European Patent Application No. 12008379.5, mailed Jul. 9, 2013, 8 pages.
Office Action dated Jul. 8, 2015 for corresponding Chinese Patent Application No. 201210557408.X, 14 pages.

* cited by examiner

*Primary Examiner* — Dung Nguyen
(74) *Attorney, Agent, or Firm* — Brinks Gilson & Lione

(57) ABSTRACT

A stereoscopic image display device, includes an array substrate having a thin film transistor; a color filter substrate opposing the array substrate and having black matrixes disposed in first and second directions; a plurality of black stripes formed on the color filter substrate and corresponding to the black matrix in the first direction; a patterned retarder film formed on the plurality of black stripes; and wherein line widths of the plurality of black stripes increase towards first and second ends in the second direction. Due to the invention, the cross-talk problem can be improved.

19 Claims, 8 Drawing Sheets

STEREOSCOPIC IMAGE DISPLAY DEVICE AND METHOD FOR MANUFACTURING THE SAME

The present application claims the priority of Korean Patent Application No. 10-2012-0071775 filed in the Republic of Korea on Jul. 2, 2012, the entirety of which is incorporated by reference herein.

BACKGROUND

1. Field of the Invention

The present disclosure relates to a stereoscopic image display device, and more particularly, to a stereoscopic image display device which has the improved up and down viewing angles.

2. Discussion of the Related Art

Recently, due to developments of various video contents, stereoscopic image display devices which the user can select the display type (two or three dimensional) has been introduced. The three-dimensional display can be accomplished using the stereoscopic technique or the autostereoscopic technique.

The stereoscopic technique uses a binocular disparity due to a separation distance between the eyes. This type of stereoscopic technique can be divided into the glasses type and the glasses-free type. Further, the glasses type can be divided into the shutter glasses type and the patterned retarder type.

The patterned retarder type display device accomplishes three-dimensional display by using polarization properties of the patterned retarder on the display panel and those on the glasses. This type of display device alternately displays a right-eye image and left-eye image on the display panel, and switches the polarizing properties from the polarizing glasses though the patterned retarder. The viewer combines the transmitted left-eye and the right-eye images respectively and realizes a three-dimensional stereoscopic image. The patterned retarder type display has advantages in having small cross-talk between two eyes and in having good display quality of high brightness compared to other types.

FIG. 1 is a cross-sectional view of a patterned retarder type stereoscopic image liquid crystal display device according to the related art.

As shown in FIG. 1, the display device 1 includes an array substrate 130 having a thin film transistor, a color filter substrate 160 having black matrixes 155, a liquid crystal layer 140 between the array substrate 130 and the color filter substrate 160, and patterned retarder films 190 on the color filter substrate 160.

The black matrix includes a plurality of first black matrix lines and a plurality of second black matrix lines. The first black matrix lines are formed in the same direction of the gate line of the array substrate 130, and the second black matrix lines are formed in the same direction of the data line. The first and second black matrix lines define pixel areas by crossing each other.

The retarder films have first and second patterned retarders 191a and 191b, the polarization axes of which are different from each other. The first and second patterned retarders 191a and 191b are disposed line by line in turn. Specifically, the retarders 191a and 191b are alternately disposed along the lines how the unit pixels are continuously and straightly disposed. One of the first and second patterned retarders 191a and 191b is for displaying left-circularly polarized light and the other is for right-circularly polarized light.

Since the retarders 191a and 191b are disposed line by line in turn and alternately display left-eye image and right-eye image, a three-dimensional (3D) cross-talk can occur according to the viewing positions. Especially, when users see the device in the front direction, left-eye image and right-eye image from near upper or lower ends of the display screen can be displayed through the same patterned retarder. As a result, there occurs a cross-talk phenomenon that the left-eye and right-eye images may pass the left-eye lens of the polarization glasses at the same time. Although in the flat panel display device, each pixel has a black matrix, but its size is not sufficient to prevent the cross-talk.

By enlarging the width of the black matrix, the viewing angle can be broadened and the 3D cross-talk can be prevented from occurring. However, this method results in lowering opening aperture ratio and brightness of the front side. Thus, the display becomes dark and proper chroma is difficult to obtain. Further, when the display device displays 2D images, the display quality gets worse owing to the lowered opening aperture ratio.

To solve the above problems, it is suggested adopting a black stripe on the black matrix, which is shown in FIG. 2.

As shown in FIG. 2, since the black stripe 185 is formed on the black matrix 155, the left-eye image may, for instance, be prevented from passing through the second patterned retarder 191b. Also, the right-eye image may be prevented from passing through the first patterned retarder 191a.

However, even in this configuration, the cross-talk error may still occur depending on a viewer's viewing position, and a compensation structure is still necessary. In particular, the cross-talk error that occurs near an upper and lower end of the display screen still offers problems.

Meanwhile, during manufacturing process when the patterned retarder film is pulled tightly before being attached to the polarization plate, the length of the patterned retarder film or total pitch may be different from the desired length. For instance in case of big sized display such as TV, the difference or error is about 150 micrometers at maximum, and in case of the smaller sized display device, the difference is about 70 micrometers. Further, while the retarder film is being attached to the polarization plate, attaching error can occur, as for TV, the error can be 50 micrometers at maximum, and as for the IT device, the error can be 25 micrometers at maximum.

If the total pitch error and the attaching error occur, the occurrence of the cross-talk can not be avoided, since the cross-talk results from minute scale. Thus high quality of display is difficult to achieve.

SUMMARY

Accordingly, the present disclosure is directed to a stereoscopic image display device that substantially obviates one or more of the problems due to limitations and disadvantages of the related art.

An object of the present disclosure is to provide a stereoscopic image display device that can be improved for up-and-down viewing angles.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a stereoscopic image display device, includes an array substrate having a thin film transistor; a color filter substrate opposing the array substrate and having black matrixes disposed in first and second directions; a plurality of black stripes formed on the color filter substrate and corresponding to the black matrix in the first direction; a patterned retarder film formed on the plurality of black stripes; and wherein line widths of the plurality of black stripes increase towards first and second ends in the second direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
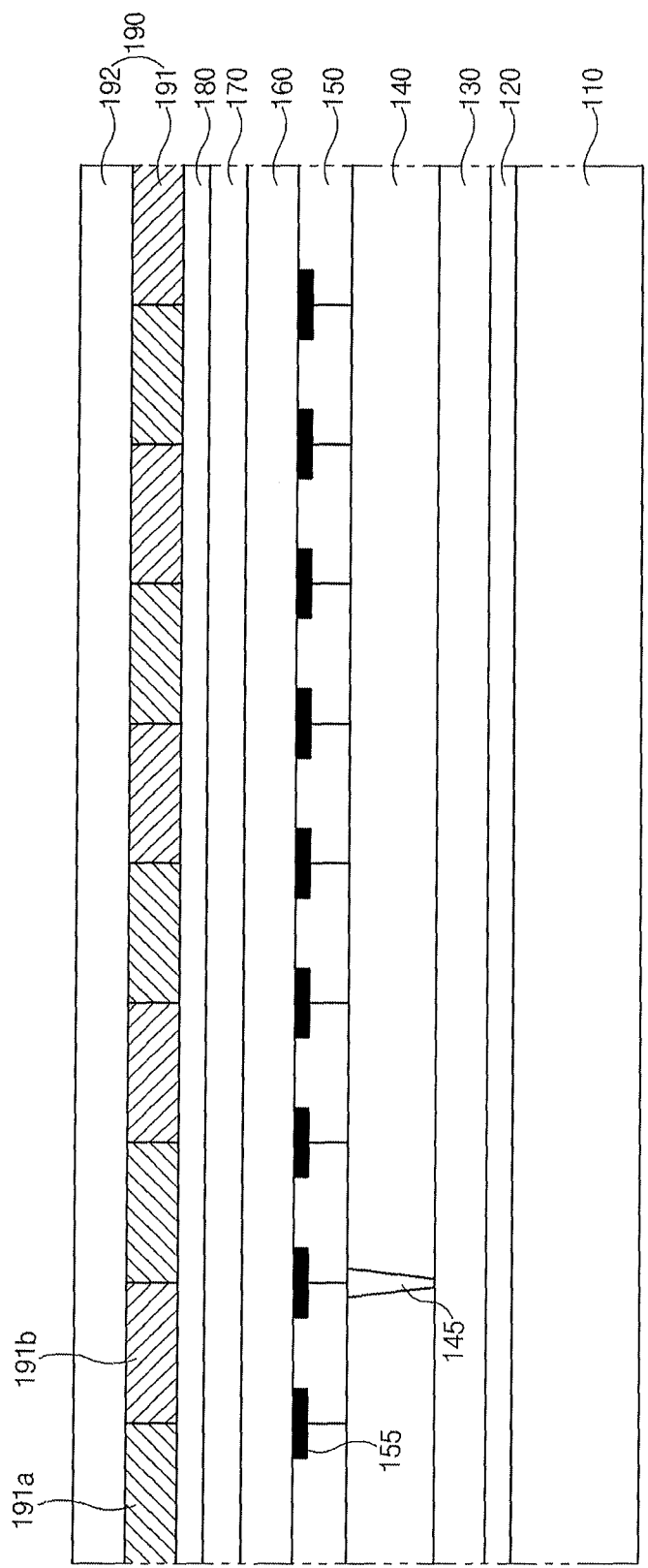
FIG. 1 is a schematic cross-sectional view of a stereoscopic image display device according to the related art.
Figure 2:
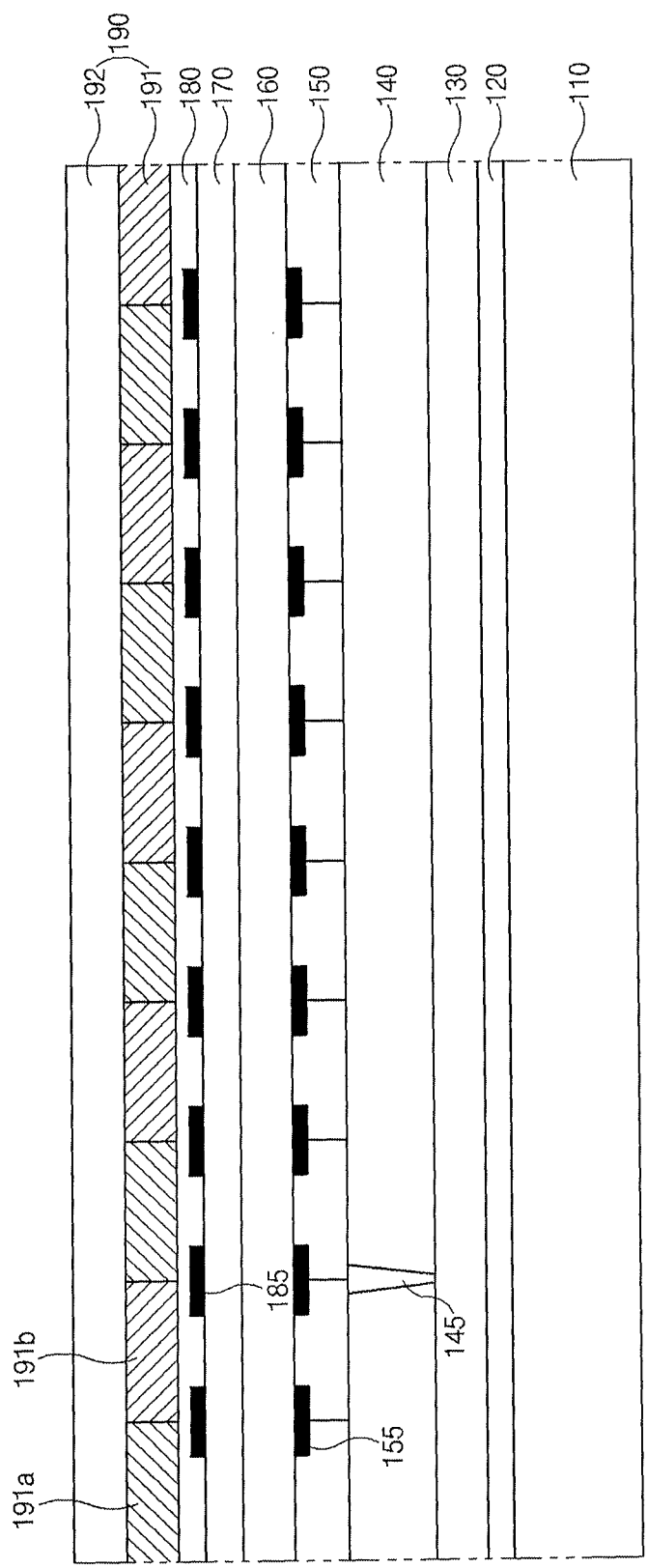
FIG. 2 is a schematic cross-sectional view of a stereoscopic image display device adopting a black stripe according to the related art.
Figure 3:
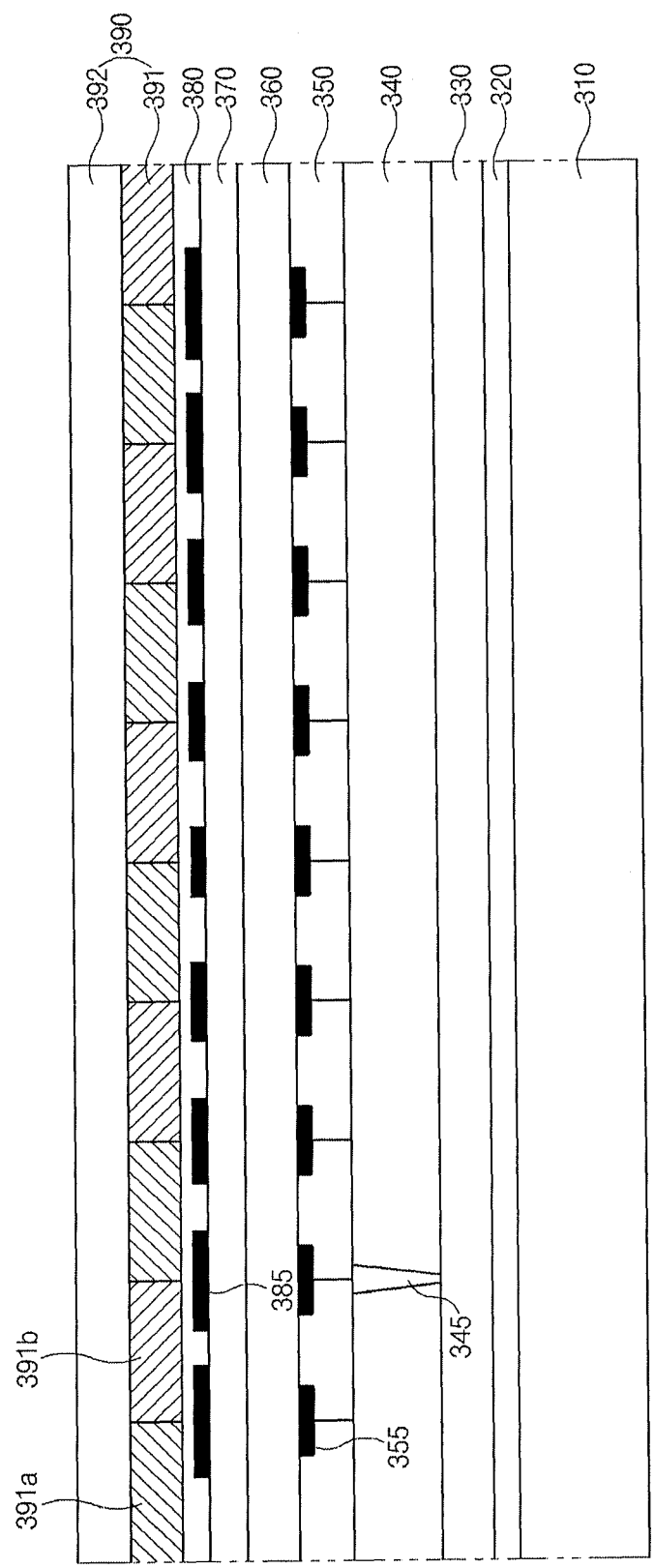
FIG. 3 is a cross-sectional view of a stereoscopic image display device according to a first embodiment of the invention.

FIG. 3 is a cross-sectional view of a stereoscopic image display device according to a first embodiment of the invention. As shown in FIG. 3, the stereoscopic image display device includes a backlight unit 310, first polarization plate 320 and second polarization plate 380, an array substrate 330, a column spacer 345, a liquid crystal layer 340, a color filter 350, a black matrix 355, a color filter substrate 360, a rear surface ITO 370, a black stripe 385, and a patterned retarder film 390.

The backlight unit 310 provides light to the display device and includes a light source (not shown) and a guide plate (not shown) for converting light to surface light. The light source may be a cold cathode fluorescent lamp (CCFL) or light emitting device (LED). The guide plate is generally formed of poly-methyl methacrylate (PMMA) and helps light from the light source to be uniformly transmitted to the entire of the guide plate utilizing total reflection phenomenon.

The first and second polarization plates 320 and 380, respectively, are formed on the opposing sides of the array substrate 330 and the color filter substrate 360. The first and second polarization plates 320 and 380, respectively, are also configured to be located on both sides of the liquid crystal layer 340. The polarization axis of the first polarization plate 320 and second polarization plate 380 cross each other. Light from the backlight unit 310 is converted to the light of tone wedge corresponding to a data voltage through the first polarization plate 320 and second polarization plate 380 and the liquid crystal layer 340.

The array substrate 330 includes a thin film transistor, a pixel electrode, a gate line and a data line. The gate signal transmitted through the gate line is turned on/off by the thin film transistor. At this time, data signals transmitted through the data line are periodically provided to the pixel electrode according to the gate signal. The data signal changes the direction of the liquid crystal to display desired gray scales.

The array substrate 330 includes a data line for providing the data voltage to red, green, and blue pixels, a gate line crossing the data line and providing a gate pulse (or scan pulse), a thin film transistor positioned in the crossing area of the data and gate lines, and providing the data voltage periodically to the pixel electrode which applies the data voltage to the liquid crystal cell, and a storage capacitor connected to the pixel electrode and maintaining the voltage of liquid crystal cell.

Meanwhile, the common electrode for generating an electric field with the pixel electrode is formed on the color filter substrate 340 in case of TN (Twisted Nematic) mode or VA (Vertical Alignment) mode, and is formed on the array substrate 330 with the pixel electrode in case of horizontal electric field driving type such as IPS (In Plane Switching) mode and FFS (Fringe Field Switching) mode.

On the color filter substrate 360, the color filters 350 may be further comprised of individual red, green and blue color filters. Between each individual color filter of the color filters 350, a black matrix 355 may be formed. The color filters 350 convert the light passing through the liquid crystal layer 330 to have red, green and blue colors. The black matrix 355 divides light-eye image and right-eye image.

On opposing surfaces of the array substrate 330 and the color filter substrate 360, an orientation layer is formed to determine a pre-tilt angle of the liquid crystal and a column spacer 345 is formed to maintain the cell gap of the liquid crystal.

On the outer surface of the color filter substrate 360, a rear surface ITO 370, a black stripe 385 on the rear surface ITO 370, a second polarization plate 380, and a patterned retarder film 390 on the second polarization plate 380 are formed.

The rear surface ITO 370 is formed along the color filter substrate 360 and discharges static electricity occurring on the color filter substrate 360. On the rear surface ITO 370 a black stripe 385 that corresponds with the black matrix 355 is formed.

On the second polarization plate 380 a patterned retarder film 390 is disposed. The patterned retarder film 390 includes a protection film 392, and first and second retarder patterns 391a and 391b, respectively, is formed on the protection film 392 line by line in turns. The first retarder pattern 391a is disposed to correspond to the row of the pixels for left-eye image processing and to convert the left-eye image to a first polarization light. The second retarderretarder pattern 391b is disposed to oppose the row of the pixels for right-eye image processing and to convert the right-eye image to a second polarization light. The first retarderretarder pattern 391a functions as a circular polarization filter through which the left light penetrates according to, for example, a counterclockwise circular polarization, and the second retarderretarder pattern 391*b* functions as a circular polarization filter through which the right light penetrates according to, for example, a clockwise circular polarization.

Meanwhile, the plurality of black stripes 385 formed on the rear surface ITO 160 is made of black carbon same as the black matrix 130 and disposed on the positions corresponding to the black matrix 130. In FIG. 3, the black matrixes 355 formed in the first direction are shown. The black matrixes 355 of FIG. 3 cross the black matrixes formed in the second direction to form a matrix structure. Thus, the black stripes 385 are formed along the first direction of the black matrixes 355 and elongate parallel from an upper end of the screen to a lower end of the screen. For example, the first direction may correspond to a horizontal direction and the second direction may correspond to a vertical direction, such that the first direction is perpendicular to the second direction.

The black stripes 385 are illustrated in FIG. 3 as increasing in width as the black stripes 385 get closer to each of the left and right ends, where the left and right ends represent the upper and lower ends of the screen. The widths of the black stripes 385 are increased as they get closer to the upper and lower ends of the screen in order to help resolve cross talking errors, according to the present invention. Further description will be provided throughout the rest of this disclosure.

Meanwhile, during the manufacturing process, before attaching the patterned retarderretarder film 390 to the second polarization plate 380, it is essential to pull the patterned retarderretarder film tight. At this time, the length of the patterned retarderretarder film 390 may be different from the desired length. Specifically, if the patterned retarderretarder film 390 is not pulled tight enough, or if it is stretched excessively to become longer than the manufactured scale, the length of the attached patterned retarder film 390 or total pitch may be longer or shorter than the designed length. The error range differs according to the attaching machine and can be up to 150 micrometers at a maximum. If such an attaching machine is used, it is difficult to achieve the effect of the black stripes 385, resulting in cross-talk phenomenon. Thus, high quality of the display cannot be obtained and the users feel uncomfortable while watching the display device.

Further, when attaching the patterned retarder film 390 to the second polarization plate 380, it is necessary to adjust the position of the patterned retarder film 390 and the corresponding pixels exactly. In other words, the position of the first retarder pattern 391*a* should correspond to that of the one or more pixels displaying left-eye image in order to convert the left-eye image to the first polarization light. Also, the second retarder pattern 391*b* should correspond to that of the one or more pixels displaying right-eye image in order to convert right-eye image to the second polarization light. If the patterned retarder film 390 were to be attached such that the patterned retarder film 390 is offset towards one of the upper and lower ends of the screen, the first and second retarder patterns of the patterned retarder film 390 will not exactly correspond to the desired pixels, thus resulting in the undesirable cross-talk error. The amount of deviation from the desired designated position or attaching error difference of the patterned retarder film 390 may occur during the manufacturing process by the attaching machine. The attaching error can be up to 50 micrometers at a maximum. Since this kind of error also causes the cross-talk problem, it is necessary to reduce or eliminate this error.

In order to resolve the problems described above, the present invention looks to increase the line thickness of the black stripe 385 to an amount that is able to compensate for the total pitching errors and the attaching errors of the patterned retarder film 390 described above. And because the total pitching error and the attaching error of the patterned retarder film 390 can occur in both directions, the line thickness of the black stripe 385 is increased in both directions, which should be considered in determining the amount of increase of the line thickness of the black stripe 385.

Hereinafter, referring to FIG. 4, the effect of the increase of the line thickness of the black stripe 385 will be explained in detail.

Figure 4:
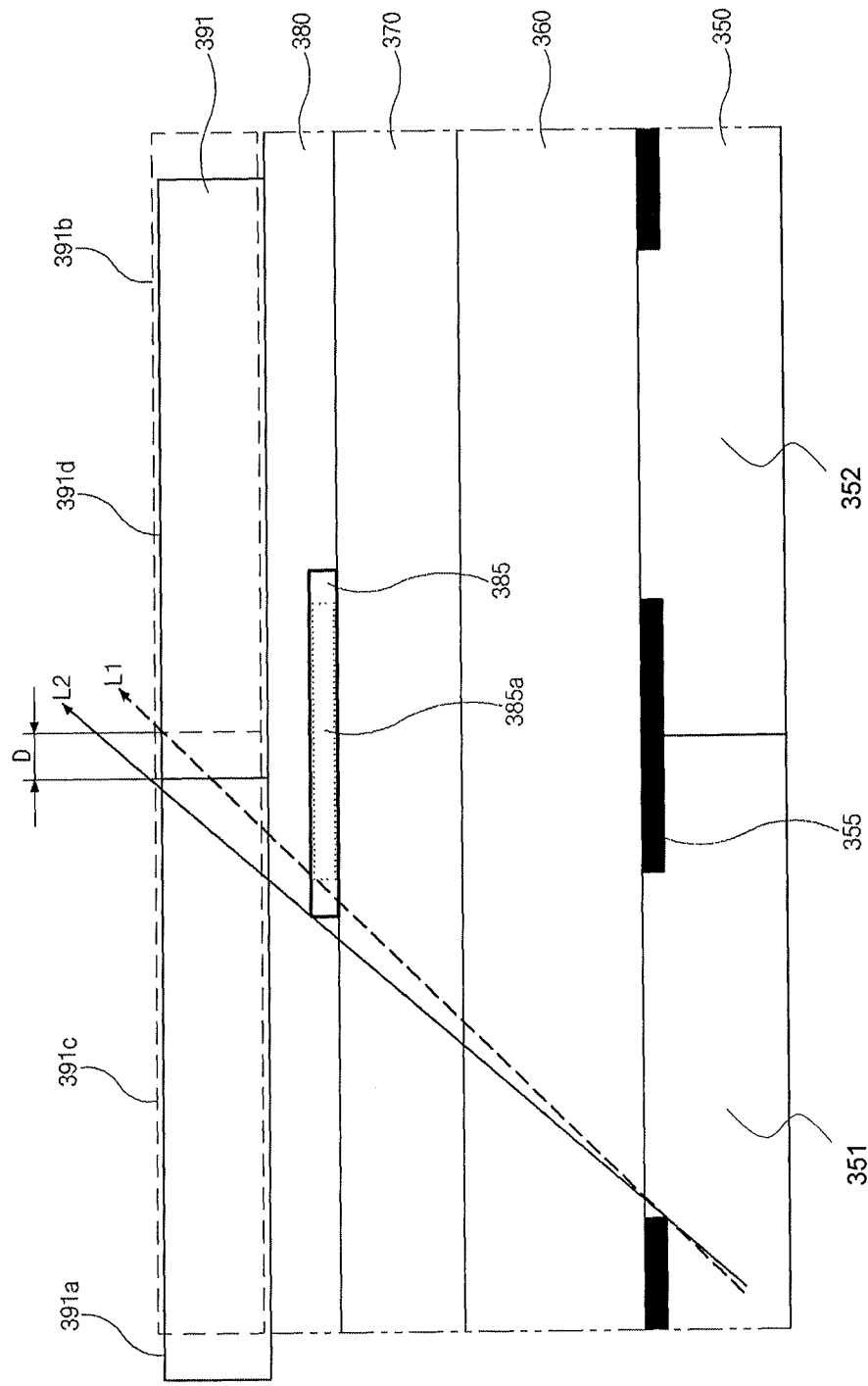
FIG. 4 is a drawing for explaining principle of compensating the total pitch error and attaching error of the patterned retarder film of the stereoscopic image display device according to the first embodiment of the invention.

FIG. 4 is a cross-sectional view illustrating the stereoscopic image display device where the retarder film 390 is attached in the condition that the error D resulting from the total pitch error and the attaching error.

In FIG. 4, the first and second retarder patterns 391*a* and 391*b* are represented by the solid lined boxes surrounding the second polarization plate 380. The first and second retarder patterns 391*a* and 391*b* may be disposed to be offset to one side by an amount D owing to the error D. The dotted line representation of first and second retarder patterns 391*a* and 391*b* that surrounds the second polarization 380 retarder is provided as a representation of a desired position of the first and second retarder patterns 391*a* and 391*b* according to a designed scale.

Further, the black stripe 385 with an increased width is represented in FIG. 4 with a thick solid lined box that is within the second polarization plate 380. The dotted line representation of the black stripe 385 that is illustrated within the thick solid lined box representation of the black stripe 385 represents a previous state of the black stripe having an ineffective smaller width.

Under the first retarder pattern 391*a* a first color filter 351 is formed, the light passing through the first color filter 351 is converted to left circularly polarized light or right circularly polarized light. Under the second retarder pattern 391*b* a second color filter 352 is formed, the light passing through the first color filter 351 is converted to left circularly polarized light or right circularly polarized light. For instance, the left-eye image is displayed through the first color filter 351 and the light transmitted through the first retarder pattern 391*a* is left circularly polarized. Further, the right-eye image is displayed through the second color filter 352 and the light transmitted through the second retarder pattern 391*b* is right circularly polarized.

At this time, since the first light line L1 including the left-eye image passes an end of the black stripe 385*a* and through the retarder film 391*c* for the left circularly polarization according to the designed scale, there is no cross-talk problem. However, if the retarder film 391*a* for left circularly polarization is positioned to be offset to the left by the error amount D, since the first light line L1 passes through the retarder film 391*b* for the right circularly polarization, and the result is cross-talk occurring.

In this case, by increasing the line width of the black stripe 385*b* of designed scale by the error D to have the line width of the black stripe 385*a*, the cross-talk can be prevented. In other words, if the black stripe 385*a* with the increased line width is formed, the second light line L2 including left-eye image passes the end of the black matrix 385*a* from the first color filter 351 and reaches the retarder pattern 391*a* for the left circularly polarization, the cross-talk can be prevented. Since all the light lines from the first color filter 351 elongate inside of the second light line L2, all of the light from the first color filter 351 can be converted to be left circularly polarized by the retarder film for the left circularly polarization and the cross talk does not occur.

Figure 5:
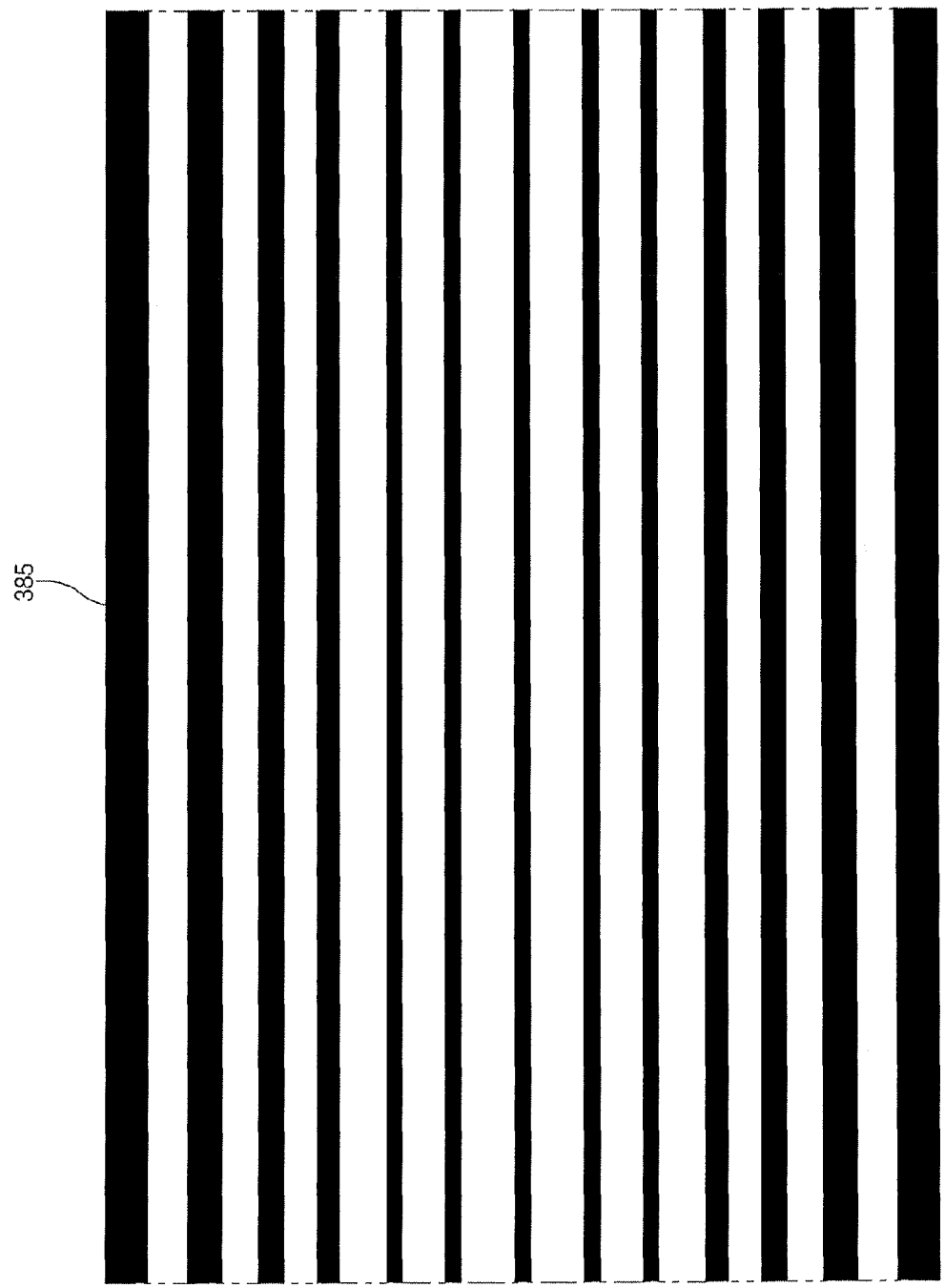
FIG. 5 is a plan view of the stereoscopic image display device according to the first embodiment of the invention.

FIG. 5 is a plan view illustrating line width of the black stripes 385. The black stripes 385 are formed parallel through out the entire screen. The line width of the black stripe 385 increases from the middle of the screen towards the upper and lower ends of the screen. The line width may be increased simply without any rule, or may be increased symmetrically towards both ends, or may be increased towards both ends by a determined value. The reason why the line width of the black stripes 385 increases is that, assuming users see the display device in the front, the change of viewing angle is especially big near the upper and down ends of the screen owing to the total pitch error and the attaching error of the retarder film 390. In other words, when users see the display device in the front, since the possibility of the cross-talk occurrence grows larger towards the upper and lower ends of the screen, by enlarging the line width of the black stripes 385 gradually towards both of ends, the total pitch error and the attaching error can be compensated for. Further, since the viewing angle changes linearly towards both of the ends, it would be effective to protect the cross-talk that the line width of the black stripes 385 is increased linearly and symmetrically towards, resulting in securing broad viewing area.

The middle portion that the line width needs not to be changed may cover to the range that the brightness drops by 10%. In other words, from the point that the brightness becomes to ⅑ of that of the center, the line width may be increased to start, which is shown in FIG. 6.

Figure 6:
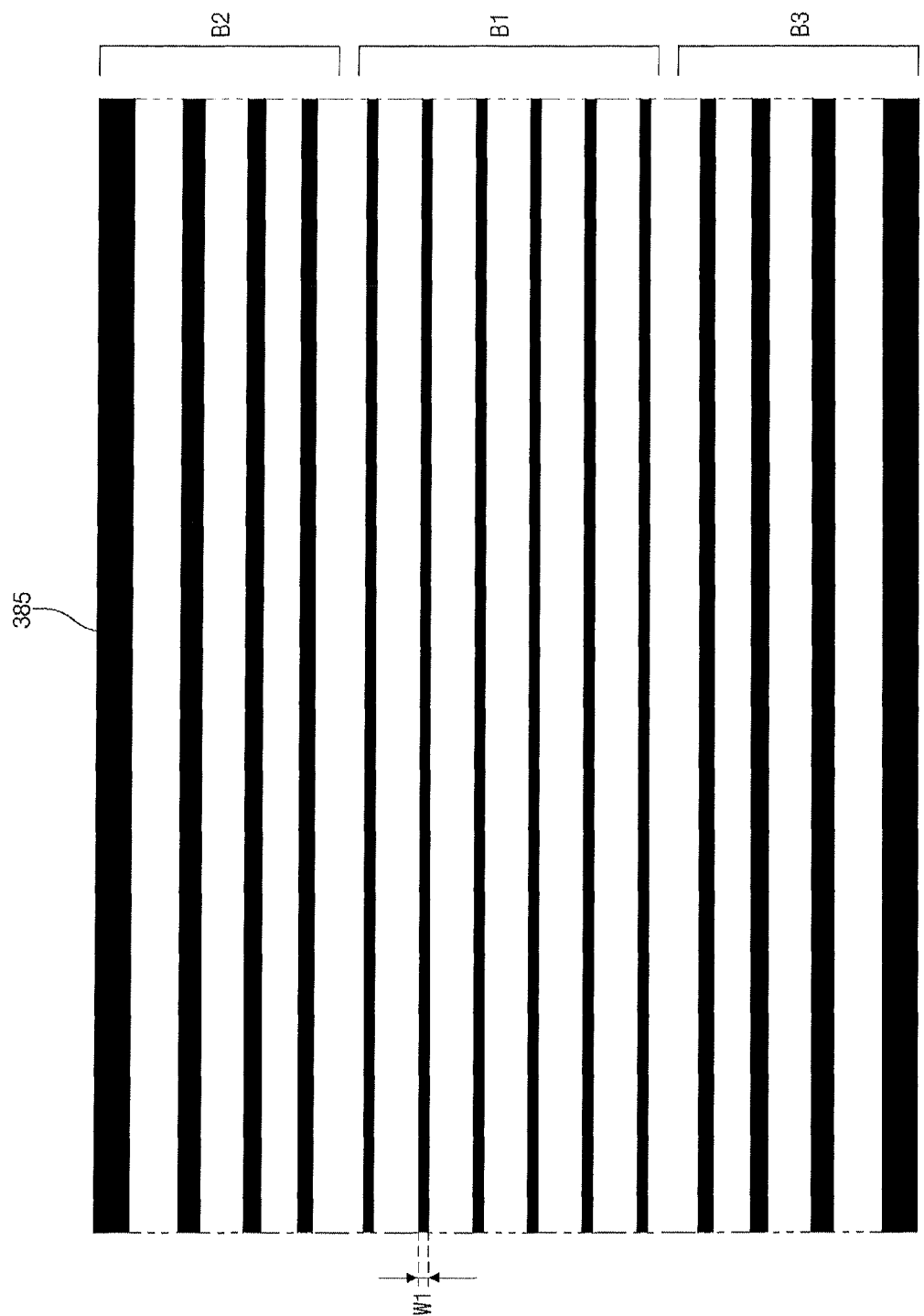
FIG. 6 is a plan view of a stereoscopic image display device according to a second embodiment of the invention.

FIG. 6 is a plane view illustrating that the black stripes 385 are divided into three groups. The first group B1 includes black stripes 385 having a first line width W1, and the second group B2 includes black stripes 385 disposed over the first group B1 with gradually increasing line width towards upper end of the screen, and the third group B3 includes black stripes 385 disposed below the first group B1 with gradually increasing line width towards a lower end of the screen. Since the viewing angle of the middle portion or a certain area from the center that the first group covers is not changed a lot and the cross-talk does not occur, thus, the line width W1 is constant. Since the increased line width of the black stripes 385 causes the brightness to be lowered, it is preferably to maintain minimum line width where the possibility of the cross-talk occurrence is very small.

The second and third groups B2 and B3 have black stripes 385 with greater line width than that of first group B1. The line width of the second and third groups may be increased symmetrically with each other or symmetrically and gradually with a constant value.

Figure 7:
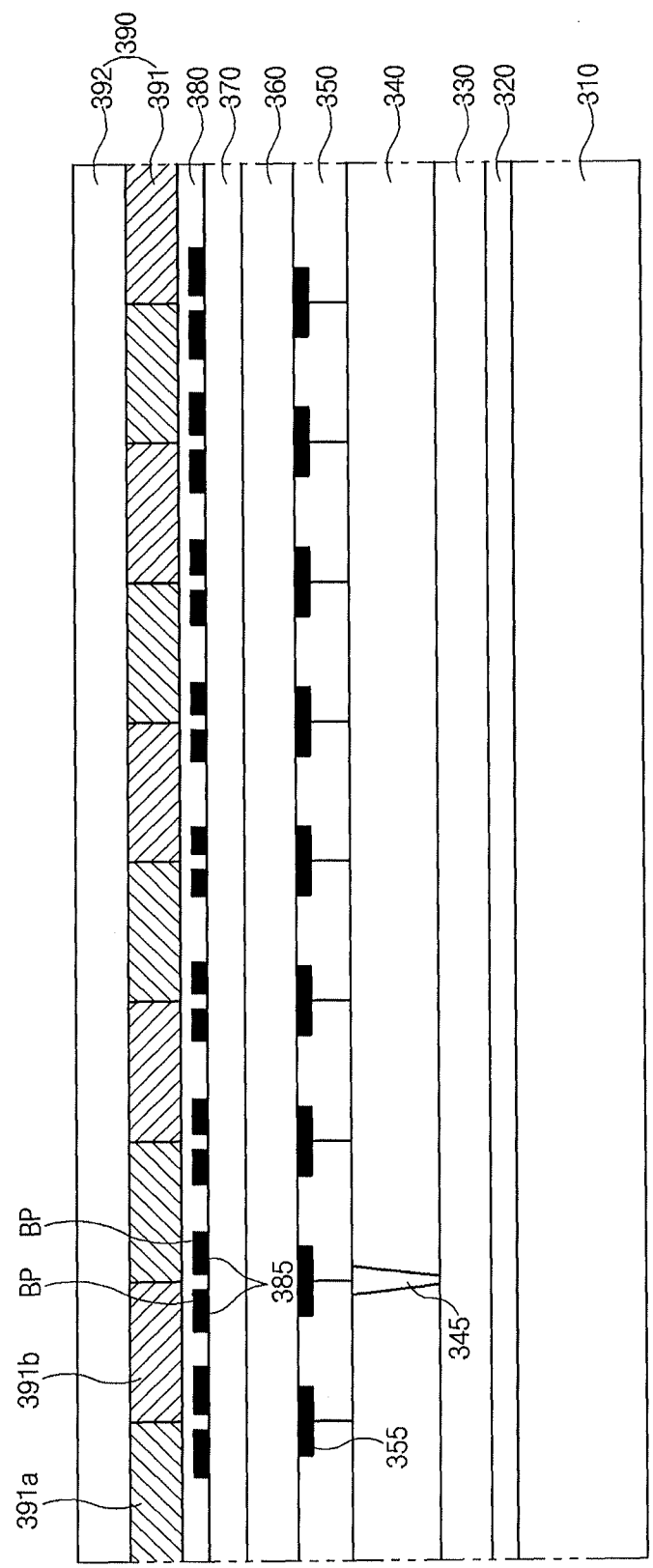
FIG. 7 is a cross-sectional view of a stereoscopic image display device according to a third embodiment of the invention.
Figure 8:
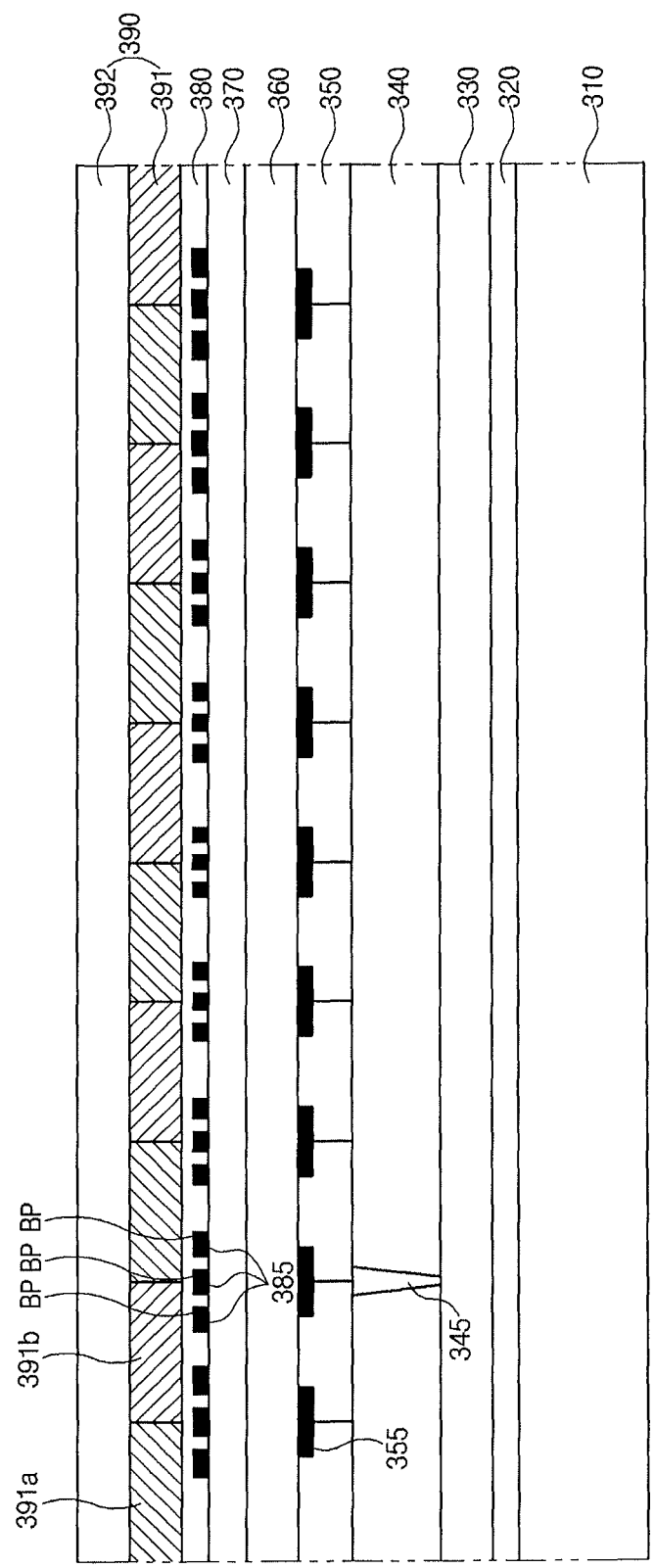
FIG. 8 is a cross-sectional view of a stereoscopic image display device according to a fourth embodiment of the invention.

FIGS. 7 and 8 are cross-sectional views showing variations of the black matrix according to the other embodiments of the invention. In FIGS. 7 and 8, each of the black stripes 385 is composed of a plurality of black patterns BP separated from each other. The number of black patterns BP is not limited. For instance, in FIG. 7, two black patterns compose the unit black stripe 385 and in FIG. 8, three black patterns BP compose the unit black stripe 385.

Since the increased line width of the black stripes 385 causes the brightness to be lowered, especially in enjoying two-dimensional display with the display device, the quality of display would be degraded seriously.

To solve the problem, if the black stripe 385 is composed of a plurality of black patterns BP separated from each other, light can penetrate the gap between the black patterns BP, which compensate for the lowering of the brightness more or less. At this time the gap between the black patterns BP may be constant.

According to the invention, by increasing the line width of the black stripes towards the upper and down ends of the screen, the cross-talk owing to the manufacturing error can be prevented and the upper-and-down viewing angle can be improved.

Further, by forming the black stripe with a plurality of black patterns, the lowering of the brightness of the display can be minimized.

It will be apparent to those skilled in the art that various modifications and variations can be made in a method of fabricating a patterned retarder of the present disclosure without departing from the sprit or scope of the invention. Thus, it is intended that the present invention covers the modifications and variations of this invention provided they come within the scope of the appended claims and their equivalents.

What is claimed is:

1. A stereoscopic image display, comprising:
an array substrate having a thin film transistor;
a color filter substrate opposing the array substrate and having a plurality of black matrixes disposed within the color filter substrate;
a plurality of black stripes formed on a polarization plate such that the plurality of black stripes correspond to the plurality of black matrixes;
a patterned retarder film formed on the plurality of black stripes; and
wherein line widths of the plurality of black stripes increase towards first and second opposing ends of the display along a direction of the black matrixes, and
wherein each black stripe from the plurality of black stripes comprises a set of two or more black patterns, and a space between adjacent black patterns of each black stripe overlaps each back matrix.

2. The stereoscopic image display device of claim 1, wherein the plurality of black stripes increase towards first and second opposing ends of the display along a horizontal or vertical direction of the black matrixes.

3. The stereoscopic image display device of claim 1, wherein the patterned retarder film comprises a first retarder pattern and a second retarder pattern, the polarization direction of the second retarder pattern being different from the polarization direction of the first retarder pattern.

4. The stereoscopic image display device of claim 3, further comprising:
a backlight emitting light;
wherein the first retarder pattern is configured to receive light for left-eye image processing, and the second retarder pattern is configured to receive light for right-eye image processing.

5. The stereoscopic image display device of claim 4, wherein the increased width of the plurality of black stripes blocks light for the left-eye image processing from being received by the second retarder pattern, and the increased widths of the plurality of black stripes blocks light for the right-eye image processing from being received by the first retarder pattern.

6. The stereoscopic image display device of claim 1, wherein each black pattern that comprises a black stripe is evenly spaced.

7. The stereoscopic image display device of claim 1, wherein a space between each black pattern is less than a space between each black stripe.

8. The stereoscopic image display device of claim 1, wherein the plurality of black stripes comprises a first group of black stripes, a second group of black stripes and a third group of black stripes, a width of black stripes in the second group and third group are greater than a width of black stripes in the first group.

9. The stereoscopic image display device of claim 8, wherein the width of black stripes in the first group are the same, and the width of black stripes in the second and third group progressively increase at a same rate towards the first and second opposing ends of the display, respectively.

10. The stereoscopic image display device of claim 8, wherein a space between subsequent black stripes in the second and third groups is smaller than a space between subsequent black stripes in the first group.

11. A method for manufacturing a stereoscopic image display device, comprising:
   forming a thin film transistor on an array substrate;
   forming a color filter substrate opposing the array substrate;
   disposing a plurality of black matrixes within the color filter substrate;
   selectively forming a plurality of black stripes on a polarization plate such that the plurality of black stripes correspond to the plurality of black matrixes, wherein line widths of the plurality of black stripes are formed to increase towards first and second opposing ends of the display along a direction of the black matrixes; and
   arranging a patterned retarder film on the plurality of black stripes,
   wherein forming the plurality of black stripes comprises forming a set of two or more black patterns for each of the plurality of black stripes, and a space between adjacent black patterns of each black stripe overlaps each back matrix.

12. The method of claim 11, wherein the plurality of black stripes increase towards first and second opposing ends of the display along a horizontal or vertical direction of the black matrixes.

13. The method of claim 11, wherein the patterned retarder film comprises a first retarder pattern and a second retarder pattern, the polarization direction of the second retarder pattern being different from the polarization direction of the first retarder pattern.

14. The method of claim 13, wherein the increased width of the plurality of black stripes blocks light for the left-eye image processing from being received by the second retarder pattern and the increased widths of the plurality of black stripes blocks light for the right-eye image processing from being received by the first retarder pattern.

15. The method of claim 11, wherein each black pattern that comprises a black stripe is evenly spaced.

16. The method of claim 11, wherein a space between each black pattern is less than a space between each black stripe.

17. The method of claim 11, wherein forming the plurality of black stripes comprises:
   forming a first group of black stripes;
   forming a second group of black stripes, and
   forming a third group of black stripes, wherein a width of black stripes in the second group and third group are greater than a width of black stripes in the first group.

18. The method of claim 17, wherein the width of black stripes in the first group are the same, and the width of black stripes in the second and third group progressively increase at a same rate towards the first and second opposing ends of the display, respectively.

19. The method of claim 17, wherein a space between subsequent black stripes in the second and third groups is smaller than a space between subsequent black stripes in the first group.

* * * * *